US009190512B2

(12) United States Patent
Lee et al.

(10) Patent No.: US 9,190,512 B2
(45) Date of Patent: *Nov. 17, 2015

(54) HIGH DENSITY TRENCH-BASED POWER MOSFETS WITH SELF-ALIGNED ACTIVE CONTACTS AND METHOD FOR MAKING SUCH DEVICES

(71) Applicant: Alpha and Omega Semiconductor Incorporated, Sunnyvale, CA (US)

(72) Inventors: Yeeheng Lee, San Jose, CA (US); Hong Chang, Saratoga, CA (US); Jongoh Kim, Portland, OR (US); Sik Lui, Sunnyvale, CA (US); Hamza Yilmaz, Saratoga, CA (US); Madhur Bobde, Sunnyvale, CA (US); Daniel Calafut, San Jose, CA (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,928

(22) Filed: Jan. 27, 2015

(65) Prior Publication Data
US 2015/0145037 A1 May 28, 2015

Related U.S. Application Data

(62) Division of application No. 13/724,228, filed on Dec. 21, 2012, now Pat. No. 8,951,867.

(51) Int. Cl.
*H01L 29/772* (2006.01)
*H01L 29/78* (2006.01)
(Continued)

(52) U.S. Cl.
CPC ...... *H01L 29/7813* (2013.01); *H01L 21/28114* (2013.01); *H01L 21/3081* (2013.01);
(Continued)

(58) Field of Classification Search
CPC .............. H01L 29/7813; H01L 29/66719; H01L 29/66734
USPC ......................................................... 257/332
See application file for complete search history.

(56) References Cited

U.S. PATENT DOCUMENTS

| 4,941,026 A | 7/1990 | Temple |
| 5,998,833 A | 12/1999 | Baliga |

(Continued)

OTHER PUBLICATIONS

Co-Pending U.S. Appl. No. 14/566,294, to Madhur Bobde, filed Dec. 10, 2014.

(Continued)

*Primary Examiner* — George Fourson, III
(74) *Attorney, Agent, or Firm* — Joshua D. Isenberg; JDI Patent

(57) ABSTRACT

Aspects of the present disclosure describe a high density trench-based power MOSFET with self-aligned source contacts. The source contacts are self-aligned with a first insulative spacer and a second insulative spacer, wherein the first spacer is resistant to an etching process that will selectively remove the material the second spacer is made from. Additionally, the active devices may have a two-step gate oxide, wherein a lower portion of the gate oxide has a thickness $T_2$ that is larger than the thickness $T_1$ of an upper portion of the gate oxide. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

9 Claims, 9 Drawing Sheets

(51) Int. Cl.
  *H01L 21/8234* (2006.01)
  *H01L 29/423* (2006.01)
  *H01L 29/66* (2006.01)
  *H01L 21/308* (2006.01)
  *H01L 27/02* (2006.01)
  *H01L 21/28* (2006.01)
  *H01L 29/10* (2006.01)

(52) U.S. Cl.
  CPC  *H01L21/823456* (2013.01); *H01L 21/823462* (2013.01); *H01L 21/823468* (2013.01); *H01L 27/0248* (2013.01); *H01L 27/0251* (2013.01); *H01L 29/1095* (2013.01); *H01L 29/42364* (2013.01); *H01L 29/42376* (2013.01); *H01L 29/6653* (2013.01); *H01L 29/6656* (2013.01); *H01L 29/66553* (2013.01); *H01L 29/7803* (2013.01); *H01L 2924/0002* (2013.01)

(56) References Cited

U.S. PATENT DOCUMENTS

| | | | |
|---|---|---|---|
| 6,251,730 | B1 | 6/2001 | Luo |
| 7,109,552 | B2 | 9/2006 | Wu |
| 7,361,557 | B2 | 4/2008 | Inagawa et al. |
| 7,691,706 | B2 | 4/2010 | Kim |
| 7,910,439 | B2 | 3/2011 | Darwish et al. |
| 8,252,647 | B2 | 8/2012 | Lee et al. |
| 8,466,513 | B2 | 6/2013 | Grivna et al. |
| 8,575,695 | B2 | 11/2013 | Bobde et al. |
| 8,664,065 | B2 | 3/2014 | Grivna |
| 8,710,582 | B2 | 4/2014 | Okumura et al. |
| 8,753,935 | B1 | 6/2014 | Bobde et al. |
| 8,809,948 | B1 | 8/2014 | Yilmaz et al. |
| 2003/0127702 | A1 | 7/2003 | Blair et al. |
| 2004/0014451 | A1 | 1/2004 | Sapp et al. |
| 2005/0062124 | A1 | 3/2005 | Chiola |
| 2005/0161758 | A1 | 7/2005 | Chiola |
| 2006/0249785 | A1 | 11/2006 | Bhalla et al. |
| 2007/0134884 | A1* | 6/2007 | Kim et al. ............ 438/424 |
| 2008/0073707 | A1 | 3/2008 | Darwish |
| 2008/0197408 | A1 | 8/2008 | Disney et al. |
| 2008/0283956 | A1 | 11/2008 | Hshieh et al. |
| 2009/0008706 | A1 | 1/2009 | Yedinak et al. |
| 2009/0224312 | A1 | 9/2009 | Taketani |
| 2009/0309156 | A1 | 12/2009 | Darwish et al. |
| 2009/0315083 | A1 | 12/2009 | Pan et al. |
| 2010/0001331 | A1* | 1/2010 | Mikasa ............ 257/306 |
| 2010/0187642 | A1 | 7/2010 | Grivna |
| 2011/0049596 | A1* | 3/2011 | Lee et al. ............ 257/296 |
| 2011/0177662 | A1 | 7/2011 | Yilmaz et al. |
| 2011/0177663 | A1 | 7/2011 | Kachi |
| 2011/0284955 | A1 | 11/2011 | Sapp et al. |
| 2012/0146090 | A1 | 6/2012 | Lui et al. |
| 2012/0220091 | A1 | 8/2012 | Challa et al. |
| 2012/0276701 | A1 | 11/2012 | Yedinak et al. |
| 2012/0292693 | A1 | 11/2012 | Lee et al. |
| 2013/0020577 | A1 | 1/2013 | Hsieh |
| 2013/0168761 | A1 | 7/2013 | Hsieh |
| 2013/0248995 | A1 | 9/2013 | Nishiwaki et al. |
| 2014/0048846 | A1 | 2/2014 | Lui et al. |
| 2014/0170823 | A1 | 6/2014 | Lin |
| 2014/0175536 | A1 | 6/2014 | Lee et al. |
| 2014/0239382 | A1 | 8/2014 | Bobde et al. |
| 2014/0239388 | A1 | 8/2014 | Lee et al. |
| 2014/0339630 | A1 | 11/2014 | Yilmaz et al. |

OTHER PUBLICATIONS

Non-Final Office Action for U.S. Appl. No. 13/776,523, dated Sep. 25, 2014.
Notice of Allowance for U.S. Appl. No. 13/724,228, dated Sep. 19, 2014.
Notice of Allowance for U.S. Appl. No. 14/270,228, dated Sep. 11, 2014.
Non-Final Office Action for U.S. Appl. No. 13/926,880, dated Mar. 17, 2015.
Notice of Allowance for U.S. Appl. No. 13/776,523, dated Apr. 6, 2015.
Notice of Allowance for U.S. Appl. No. 14/329,806, dated May 6, 2015.
Final Office Action for U.S. Appl. No. 13/926,880, dated Sep. 16, 2015.
Non-Final Office Action for U.S. Appl. No. 14/566,294, dated Jul. 14, 2015.
Notice of Allowance for U.S. Appl. No. 14/566,294, dated Sep. 17, 2015.

* cited by examiner

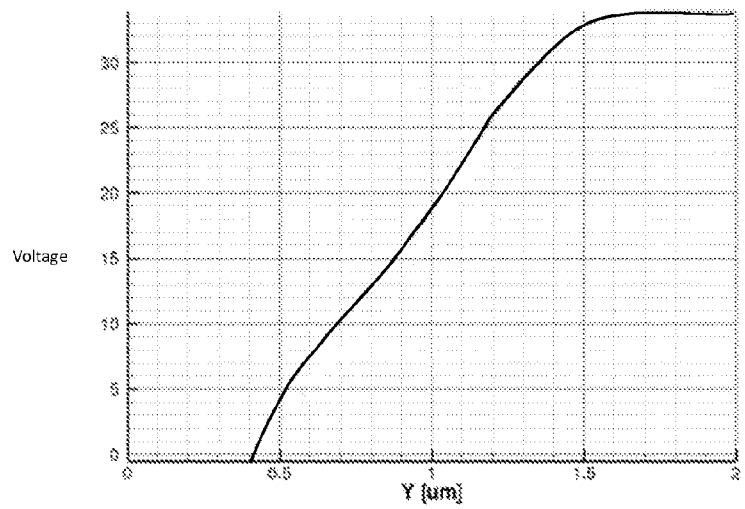
FIG. 5B
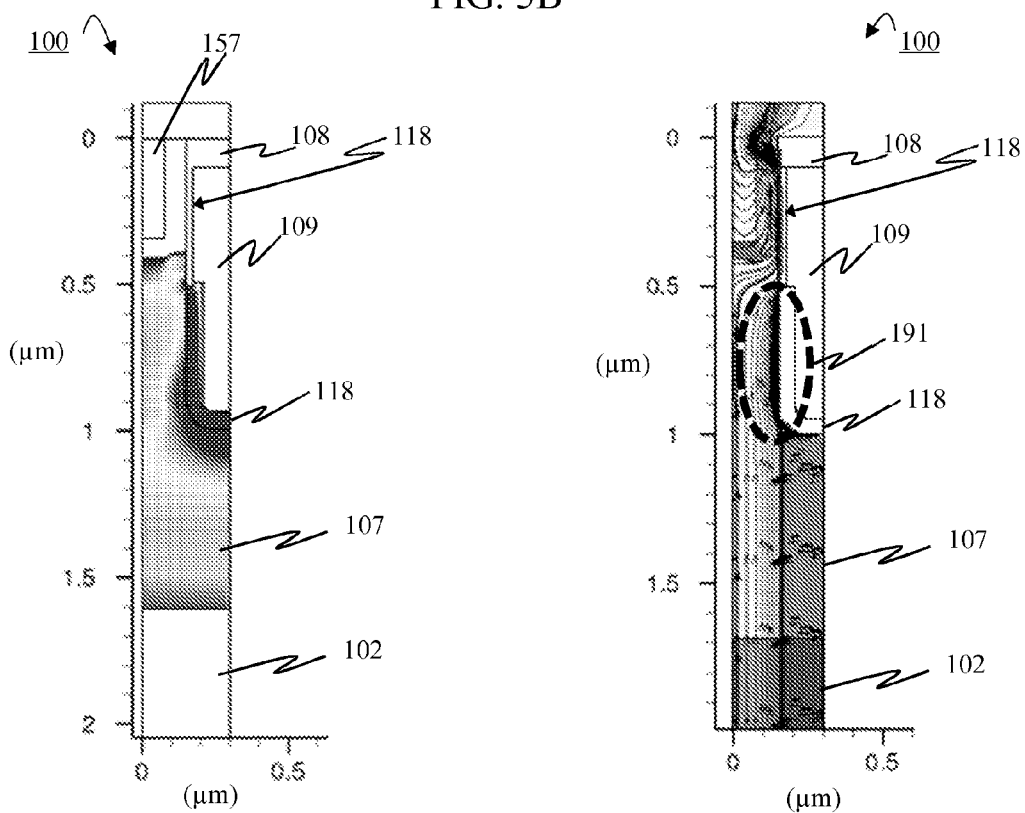
FIG. 5A
FIG. 5C

HIGH DENSITY TRENCH-BASED POWER MOSFETS WITH SELF-ALIGNED ACTIVE CONTACTS AND METHOD FOR MAKING SUCH DEVICES

CLAIM OF PRIORITY

This application is a continuation of commonly-assigned, co-pending application Ser. No. 13/724,228, filed on Dec. 21, 2012, the entire disclosures of which are incorporated herein by reference.

CROSS-REFERENCE TO RELATED APPLICATIONS

This application is related to commonly-assigned, co-pending application Ser. No. 13/724,180 (Attorney Docket Number ANO-058/US), filed on Dec. 21, 2012 and entitled "DEVICE STRUCTURE AND METHODS OF MAKING HIGH DENSITY MOSFETS FOR LOAD SWITCH AND DC-DC APPLICATIONS" to Yilmaz, Bobde, Chang, Lee, Calafut, Kim, Lui, and Chen, the entire disclosures of which are incorporated herein by reference.

This application is related to commonly-assigned, co-pending application Ser. No. 13/724,093 (Attorney Docket Number ANO-059/US), filed on Dec. 21, 2012 and entitled "HIGH FREQUENCY SWITCHING MOSFETS WITH A LOW OUTPUT CAPACITANCE USING A DEPLETABLE P-SHIELD" to Bobde, Yilmaz, Lui, and Ng, the entire disclosures of which are incorporated herein by reference.

FIELD OF THE INVENTION

This invention generally relates to metal oxide silicon field effect transistors (MOSFETs) and more particularly to high density trench based power MOSFETS.

BACKGROUND OF THE INVENTION

Low voltage power MOSFETs are often used in load switching applications. In load switching applications it is desirable to reduce the on-resistance ($R_{ds}$) of the device. Specifically, the $R_{dsA}$ of the device needs to be minimized, where $R_{dsA}$ is the on-resistance of the device multiplied by the active area of the device. Additionally, low voltage power MOSFETs are commonly used in high frequency DC-DC applications. In these applications it is often desirable to maximize the device's switching speed. Three of the most important parameters for optimizing the switching speed are: 1) $R_{ds} \times Q_g$; 2) $R_{ds} \times Q_{OSS}$; and 3) the ratio of $Q_{gd}/Q_{gs}$. First, the product of the $R_{ds}$, and the gate charge ($Q_g$) is a measure of the device conduction and switching losses together. $Q_g$ is the sum of the gate to drain charge ($Q_{gd}$) and the gate to source charge ($Q_{gs}$). In the second parameter, $Q_{OSS}$ is a measure of the capacitances that need to be charged and discharged whenever the device is switched on or off. Finally, minimizing the ratio of $Q_{gd}/Q_{gs}$ reduces the possibility of the device turning on due to a large dV/dt when the device is being switched off.

Trench based MOSFETs, as shown in FIG. 4A, were designed in part in order to reduce $R_{dsA}$ of the device. The design of trench based MOSFETs allowed for the removal of the JFET structure that was present in planar MOSFETs. By eliminating the JFET, the cell pitch could be reduced. However, the basic trench based MOSFET does not have any charge balancing in the body regions, and therefore causes an increase in the $R_{dsa}$. Also, the relatively thin gate oxide generates a high electric field under the trench, which leads to a lower breakdown voltage. Low doping concentrations are needed in the drift region in order to support the voltage, and this increases the $R_{dsA}$ for structures with thinner gate oxides. Further, as cell pitch continues to decrease, the trench based MOSFET may become a less desirable choice because of the difficulty in reducing the thickness of the gate oxide further.

Previous attempts have been made to solve these problems through various designs. A first example is a shielded gate MOSFET as shown in FIG. 4B and described in U.S. Pat. No. 5,998,833 to Baliga. The use of a trench-based shield electrode connected to source potential instead of a larger gate electrode reduces the gate-to-drain capacitance ($C_{gd}$) of the MOSFET and improves switching speed by reducing the amount of gate charging and discharging needed during high frequency operation. However, the MOSFET device described by Baliga exhibits a high output capacitance because the source potential is capacitively coupled to the drain via the shield electrode. Also, in order to sustain the blocking voltage a thick oxide is required. Finally, complex processing is required in order to produce two electrically separated polysilicon electrodes within the same trench. The complexity of the fabrication is further accentuated when the pitch of the device is scaled downwards to the deep sub-micron level.

Finally, the MOSFET design shown in FIG. 4C and described in U.S. Pat. No. 4,941,026 to Temple, has certain characteristics that may be utilized to optimize the switching characteristics of a device. The device in Temple utilizes a two-step gate oxide with a thin layer of oxide near the top of the gate and a thicker layer of oxide in the bottom portion of the gate in order to create a device that has a low channel resistance and a low drift resistance. The thin upper portion of the gate oxide provides good coupling between the gate and body region which generates a strong inversion and low on-resistance in a channel next to the thin upper portion. The thicker gate oxide on the bottom creates a charge balancing effect and allows for the drift region to have an increased doping concentration. A higher doping concentration in the drift region decreases its resistance.

However, the device shown in FIG. 4C is not easily downwards scalable because it is highly susceptible to body contact misalignment errors. For example, if the pitch of the devices was scaled to the deep sub-micron level e.g., 0.5-0.6 μm, then the contact mask misalignment, relative to the gate, may greatly alter the characteristics of the device. In order to provide a good ohmic contact to the body region, an ohmic contact that is highly doped with dopants of the same conductivity type as the body region may be implanted after the contact mask has been used. If the contact mask is aligned too close to the gate, namely not landing exactly at the center of the silicon mesa, then highly doped implants used to generate an ohmic contact with the body may end up in the channel. If the highly doped ohmic region is in the channel, then the threshold voltage and the on-resistance of the device will be impacted. Also, if the contact mask is aligned too far away from the gate, then the turn on of the bipolar junction transistor (BJT) becomes an issue. Since the contact is further from the trench, the length of the body region is increased and therefore so is its resistance. As the resistance of the body region increases, it increases the voltage drop across the body region. The larger voltage drop across the body region will make it easier for the parasitic BJT to turn on and ruin the device.

Therefore, in order to fabricate power MOSFET devices with a deep sub-micron pitch that are optimized for use as load switches and high frequency DC-DC applications there is a need for a device and method capable of self-aligning the contacts to the gate in order to prevent aforementioned side effects.

It is within this context that embodiments of the present invention arise.

BRIEF DESCRIPTION OF THE DRAWINGS

FIGS. 5A-5C are diagrams and a graph that explain the electrical characteristics of the MOSFET devices according to aspects of the present disclosure.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N-type device is described for purposes of illustration. P-type devices may be fabricated using a similar process but with opposite conductivity types.

According to aspects of the present disclosure high density trench-based power MOSFET may be fabricated with self-aligned source and body contacts. The source/body contacts are self-aligned with a first insulative spacer and a second insulative spacer. By way of example, the first spacer may be resistant to an etching process that will selectively remove the material the second spacer is made from, or alternatively the first spacer may be of the same material the second spacer is made from. By way of example, the spacers may be made from a nitride material. Additionally, the active devices may have a two-step gate oxide in which a lower portion of the gate oxide has a thickness $T_2$ that is larger than the thickness $T_1$ of an upper portion of the gate oxide. The two-step gate oxide combined with the self-aligned source/body contacts allow for a highly scalable device that is capable of being produced with active device pitch in the deep sub-micron level, e.g., 0.5-0.6 microns.

Figure 4A:
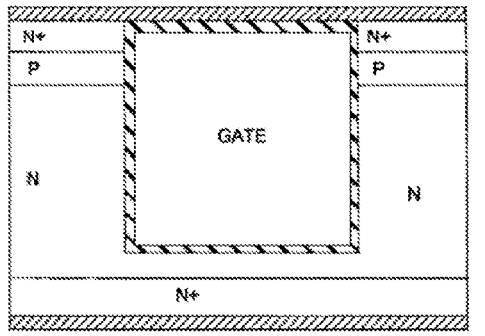
FIG. 4A-C are cross sectional views of prior art trench based power MOSFETs.
Figure 4B:
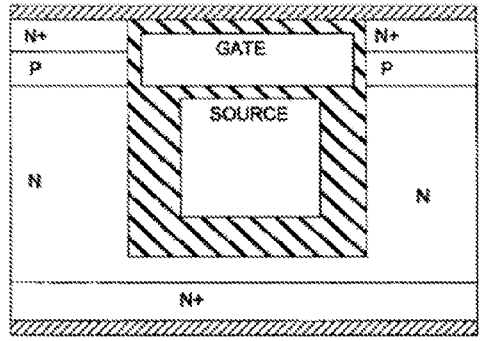
Figure 4C:
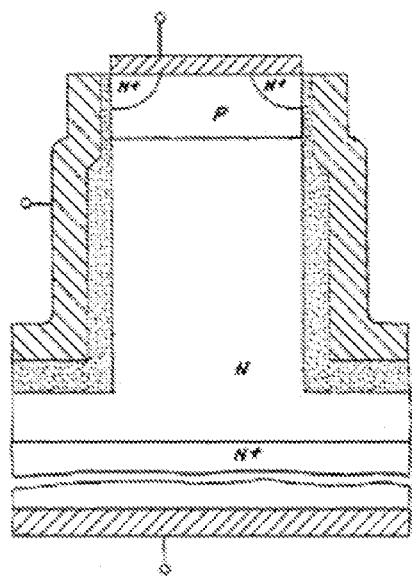

The two step gate oxide allows for a significant portion of the voltage to be supported by a lower portion of the gate oxide 118. This reduces the amount of voltage that the epitaxial layer 107 must support. FIG. 5A is a cross sectional view of an active device that displays the strength of the electric field, where darker shading indicates a higher electric field strength. As shown by the heavy shading along the bottom portion of the trench, the lower portion of the gate oxide 118 supports a large portion of the electric field. FIG. 5B is a graph depicting voltage that has been blocked by device 100 versus the depth into the substrate. Device 100 begins blocking voltage at a depth of approximately 0.5 microns. This depth is consistent with the depth at which the lower portion of the gate oxide 118 with a thickness $T_2$ begins. Near the bottom of the trench and the oxide 118 (about 1.0 micron) the device has blocked a total of approximately 18 volts. This greatly reduces the voltage blocking burden of the epitaxial layer 107. Therefore, the doping concentration of epitaxial drift layer 107 may be increased in order to reduce the $R_{dsA}$ of device. The increase in the doping concentration of the epitaxial layer 107, along with lower channel resistance due to smaller cell pitch, allows for an approximately 90% or more decrease in the $R_{dsA}$ when compared to the prior art trench based MOSFET designed to support the same voltage described in FIG. 4A, or an approximately 37% or more decrease in the $R_{dsA}$ when compared to the prior art split gate MOSFET designed to support the same voltage described in FIG. 4B.

The $R_{dsA}$ of the device is further decreased because of the location of the accumulation region 191. As shown in FIG. 5C, when the gate is turned on a narrow accumulation region 191 is formed in the upper portion of the epitaxial layer 107 adjacent to the trench sidewall. By way of example, the accumulation region 191 may be approximately 300-400 Å wide. This concentration of charge carriers along the accumulation region reduces the resistance over the upper portion of the epitaxial layer 107. Further, since the accumulation region 191 is thin, reducing the cell pitch does not affect the resistance as long as the pitch is greater than the width of the accumulation region 191. This feature is not present in the split gate MOSFET device described above with respect to FIG. 4B. In a split gate MOSFET device, the conductor in the lower portion of the trench is kept at source potential, which prevents an accumulation region from forming along a narrow path proximate to the sidewall. Therefore, it is not practical to shrink the pitch of the split gate MOSFET to the deep sub-micron level.

Figure 1A:
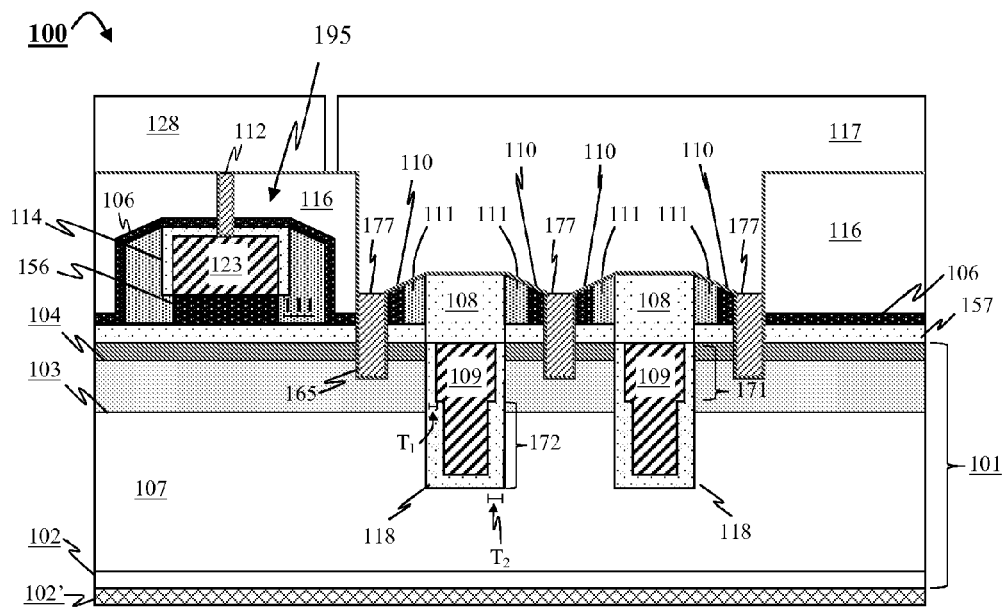
FIG. 1A is a cross sectional view of the active region of a device according to an aspect of the present disclosure.

FIG. 1A is a cross sectional view of the active area of a device structure 100 according to aspects of the present disclosure. The device structure 100 may be built on a semiconductor substrate 101. The device structure 100 may be one of a plurality of such device structures formed on the substrate 101 that make up a MOSFET device. Furthermore, a plurality of such devices may be formed on the same substrate, as is common in semiconductor manufacturing. The substrate 101 may be suitably doped to be an N-type or a P-type substrate. By way of example, and not by way of limitation, the semiconductor substrate 101 may be an N-type silicon substrate. The semiconductor substrate may have a heavily doped $N^+$ drain region 102. By way of example, the drain region 102 may have a doping concentration of approximately $10^{19}$ cm$^{-3}$ or greater. The drain region 102 may be electrically connected to a drain electrode 102' formed on a bottom surface of the semiconductor substrate. Above the drain region 102 may be a lightly doped $N^-$ drift region 107. By way of example, the drift region 107 may have a doping concentration that is approximately between $10^{15}$ cm$^{-3}$ and $10^{17}$ cm$^{-3}$. In the top portion of the semiconductor substrate 101 of a first conductivity type, a suitably doped body layer 103 of a second conductivity type that is opposite to the first conductivity type of the semiconductor substrate 101 may be formed. A source region 104 of the first conductivity type may be formed in a top portion of the body layer 103. By way of example, and as used throughout the remainder of the disclosure, the semiconductor substrate 101 may be an N-type semiconductor, the body region 103 may be a P-type, and the source region 104 may be N-type.

According to aspects of the present disclosure, the active area of the device structure 100 may comprise a plurality of trench based power MOSFETs. Certain aspects of the present disclosure may also optionally include one or more electrostatic discharge (ESD) protection features 195. The trench based power MOSFETs are formed by creating a trench that extends through the P-body region 103 and into the semiconductor substrate 101. Each trench may have an upper portion 171 and a bottom portion 172. A dielectric material 118 may line the walls of the trench. The dielectric material 118 may have a thickness $T_2$ in the bottom portion of the trench 172 and the dielectric material 118 may have a thickness $T_1$ in the upper portion of the trench 171. According to aspects of the present disclosure, the thickness $T_1$ is smaller than the thickness $T_2$. By way of example, the dielectric material 118 may be an oxide. The remainder of the trench may be filled with a suitable material to form a gate electrode 109. By way of example, the gate electrode 109 may be formed with polysilicon. The gate electrode 109 is electrically isolated from a source metal 117 by an insulative gate cap 108 which is disposed above the trench. An insulative layer 157 may also be formed above the source region 104. A first insulative spacer 111 may be disposed along each vertical edge of the insulative gate cap 108. By way of example, and not by way of limitation, the first insulative spacer 111 may be the same material as the insulative cap 108. By way of example and not by way of limitation, the insulative gate cap 108, the insulative layer 157, and the first insulative spacer 111 may be an oxide.

Though not shown in FIG. 1A, gate electrodes 109 are connected to a gate pad and are maintained at a gate potential. The source regions 104 are electrically connected to the source metal 117. By way of example and not by way of limitation, the connection may be made through the use of a vertical connection 177 which extends through the insulating layer 105. By way of example and not by way of limitation, the vertical connections 177 may be made from a conductive material such as tungsten. Some additional aspects of the present disclosure may also include a barrier metal 165 that lines the vertical connections 177. The barrier metal may be useful to prevent unwanted diffusion. By way of example, and not by way of limitation, the barrier metal 165 may be titanium or titanium nitride.

Additionally, a second insulative spacer 110 may separate the vertical connection 177 from the first insulative spacer 111. By way of example, and not by way of limitation, the first insulative spacer 111 may be made of a material that will resist an etchant that selectively removes the material that the second insulative spacer 110 is made from. By way of example, the first insulative spacer 111 may be an oxide, and the second insulative spacer 110 may be a nitride. The oxide is resistant to a hot phosphoric acid, while the nitride would be selectively etched away by the hot phosphoric acid. Additionally, the first and second insulative spacers 110, 111 may be made from the same insulative material, such as a nitride. The first and second insulative spacers 111, 110 allow for the vertical connections 157 to be self-aligned. The use of existing structures on the device 100 instead of a contact mask in order to produce the vertical connections 177 for the source contacts minimizes possible error due to misalignment.

The ESD protection feature 195 may be formed above the insulative layer 157. A nitride layer 156 may be disposed on the top surface of the insulative layer 157. Above the nitride layer 156, an ESD electrode 123 may be formed. By way of example and not by way of limitation the ESD electrode 123 may be formed with polysilicon. The ESD electrode 123 is substantially shielded along all surfaces except the bottom surface by an ESD insulation cap 114. By way of example, the ESD insulation cap 114 may be an oxide. First insulative spacers 111 may also be formed along the sides of the ESD insulation cap 114 and along the sides of the nitride layer 156. A second nitride layer 106 may be formed around the second insulation material 111 and over the tope surface of the ESD insulation cap 114. An outer insulator 116 may be formed around the second nitride layer 106. By way of example, and not by way of limitation, the outer insulator 116 may be borophosphosilicate glass (BPSG). The ESD electrode 123 is electrically connected to an ESD metal 128. By way of example and not by way of limitation, the connection may be made through the use of a vertical connection 112 which extends through the outer insulator 116, the second nitride layer 106, and the ESD insulation cap 114. By way of example and not by way of limitation, the vertical connection 112 may be made from a conductive material such as tungsten. According to some aspects of the present disclosure, the vertical connection 112 may be lined with a barrier metal 165 such as titanium, or a titanium nitride.

Figure 1B:
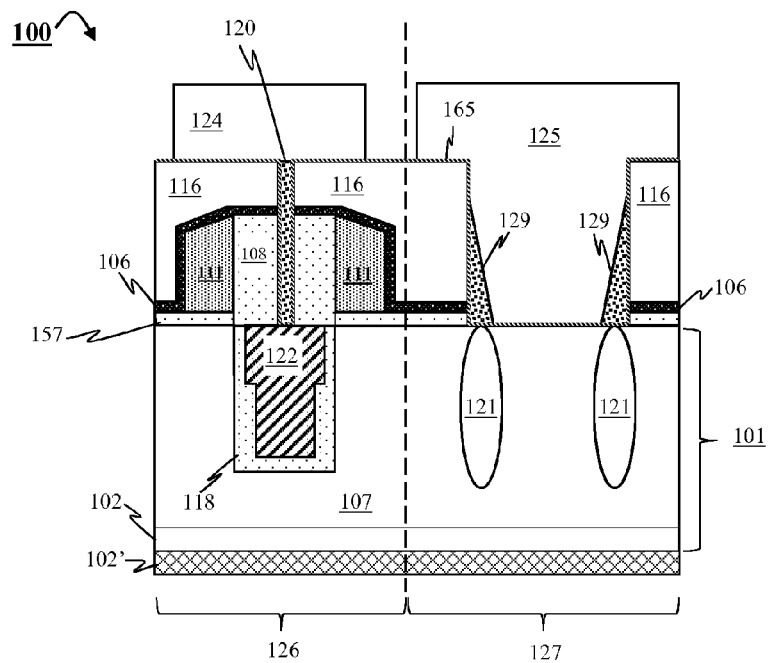
FIG. 1B is a cross sectional view of the gate pickup region and the Schottky region according to an aspect of the present disclosure.

According to some aspects of the present disclosure, the active region may optionally be formed with an accompanying non-active area. FIG. 1B is a cross sectional view of the non-active area of device structure 100. The area to the left of the dotted line is the gate pickup region 126, and the area to the right of the dotted line is a Schottky region 127. Both the gate pickup region 126 and the Schottky region 127 are formed on the semiconductor substrate 101. However, the semiconductor substrate 101 lacks a body region 103 and a source region 104 that are present in the active region.

The gate pickup structure is formed by creating a trench that extends through a top portion of the semiconductor substrate 101. A dielectric material 118 may be line the walls of the trench. The dielectric material 118 may have a thickness $T_1$ for an upper portion of the trench and a thickness $T_2$ for a bottom portion of the trench. The thicknesses of $T_1$ and $T_2$ are substantially similar to the active device trenches. The remainder of the trench is filled with a suitable material to form a gate pickup electrode 122. By way of example and not by way of limitation the gate pickup electrode 122 may be formed with polysilicon. An insulative cap 108 may be disposed above the trench. An insulative layer 157 may also be disposed above the top surface of the semiconductor substrate 101. A first insulative spacer 111 may be formed along each vertical edge of the insulative cap 108. By way of example, and not by way of limitation, the first insulative spacer 111 may be the same material as the insulative cap 108. By way of example and not by way of limitation, the insulative cap 108, the insulative layer 157, and the first insulative spacer 111 may each be an oxide. A nitride layer 106 may be formed over the top surface of the insulative cap 108 and along the top surface of the first insulative spacer 111 and along the exposed side surfaces of the first spacer 111. An outer insulator 116 may be formed around the nitride layer 106. By way of example, and not by way of limitation, the outer insulator 116 may be BPSG.

The gate pickup electrode 122 may be electrically connected to a gate metal 124. By way of example and not by way of limitation, the connection may be made through the use of a vertical gate contact 120 which extends through the outer insulator 116, the nitride layer 106, and the insulative cap 108. By way of example and not by way of limitation, the vertical connection 120 may be made from a conductive material such as tungsten. According to some aspects of the present disclosure, the vertical connection 120 may be lined with a barrier metal 165 such as titanium, or a titanium nitride.

The Schottky region 127 comprises one or more body clamp (BCL) regions 121 configured to prevent the active devices from operating above their breakdown voltages. As such the depth of the BCL regions 121 need to be designed such that the Schottky breakdown voltage for such regions is higher than the active device breakdown voltage. In an N-type semiconductor substrate 101, P-type dopants are implanted into the substrate 101 to form the BCL regions 121. By way of example, and not by way of limitation, the dopants may be introduced with one or more implantation processes with the use of an ion implantation system. The dopants may be implanted with voltages ranging between 10 keV and 500 keV. Some aspects of the present disclosure include metal contacts 129, which may be remnants from a prior processing step that formed the contacts 120 and 112 By way of example, and not by way of limitation, the metal contacts may be tungsten. The Schottky contact 125 may be deposited over the metal contacts 129 and over the semiconductor substrate 101. According to some aspects of the present disclosure, the Schottky contact 125 and the semiconductor substrate may be lined with a barrier metal 165 such as titanium, or a titanium nitride. Additionally, the gate metal 124 and the Schottky contact 125 are electrically isolated from each other.

Figure 2:
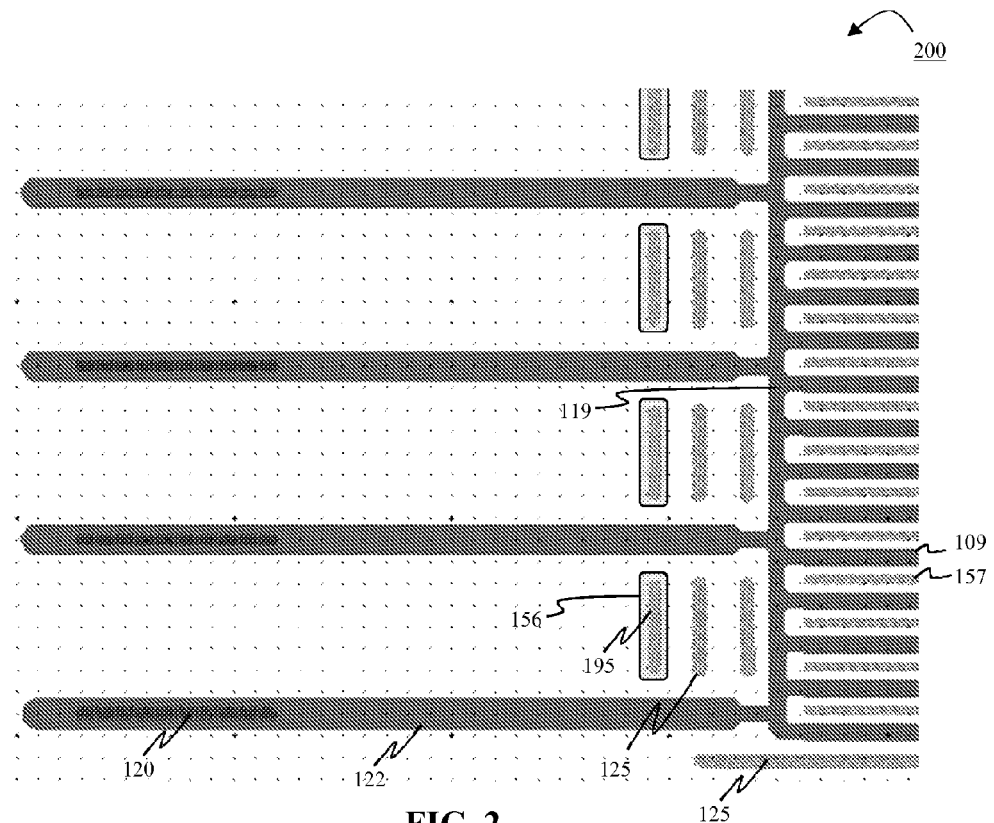
FIG. 2 is an overhead view of the layout of the device according to an aspect of the present disclosure.

FIG. 2 is a diagram of the layout for a device structure 100. The layout shows the gate electrodes 109 alternating with source contacts 157 in a device region. The source contacts 157 extend perpendicular to the plane of the drawing to make electrical contact with the source metal 117. Gate runners 119 electrically connect to the gate electrodes 109 to gate pickups 122. The gate electrodes, gate runners and gate pickups may be made from the same material, e.g., polysilicon, which may be formed in corresponding trenches in a common step. Gate contacts 120 extend perpendicular to the plane of the drawing to make electrical contact with the gate metal 124 (not shown). The gate metal 124 may be initially formed as part of the same metal layer as the source metal 117. The gate metal 124 may be electrically isolated from the source metal 117, e.g., by masking, etching and dielectric fill processes, as are commonly done for this purpose.

The BCL regions may be placed outside the active device region, which can be seen from the locations of Schottky contacts 125 in FIG. 2. Additionally, ESD structures 195 may be formed outside of the active device region. The ESD structures 195 may be formed over an insulator, such as insulative layer 105.

Figure 3A:
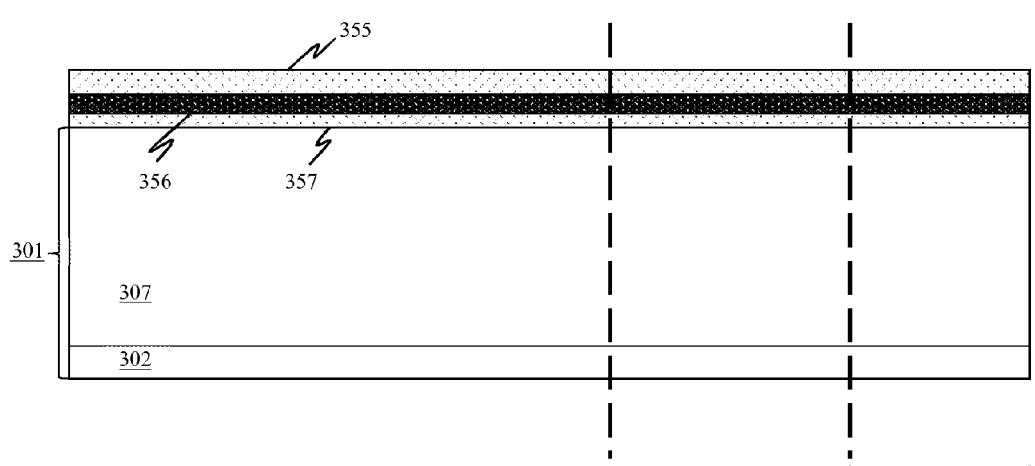
FIG. 3A-O are cross sectional views of the processing steps used to fabricate the active region, the gate pickup region, and the Schottky region, according to an aspect of the present disclosure.
Figure 3B:
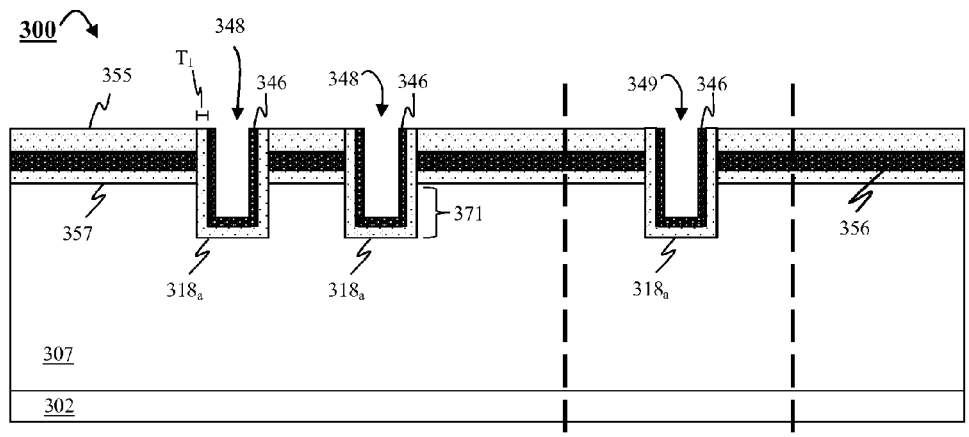
Figure 3C:
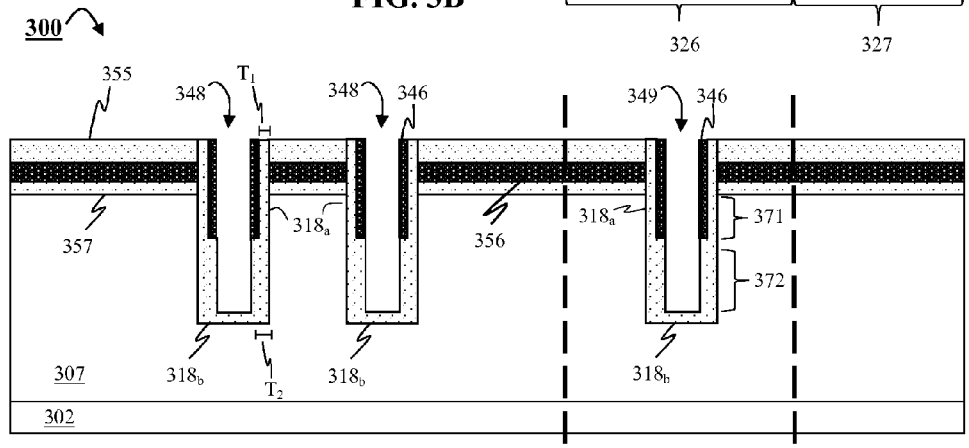
Figure 3D:
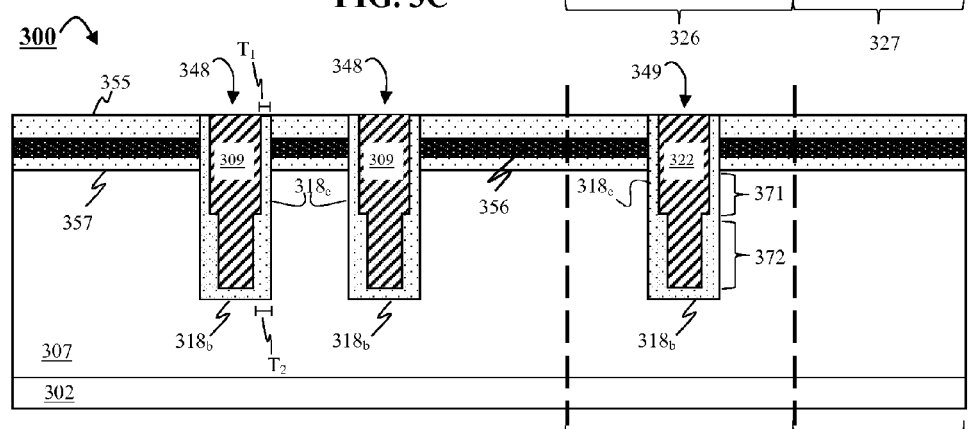
Figure 3E:
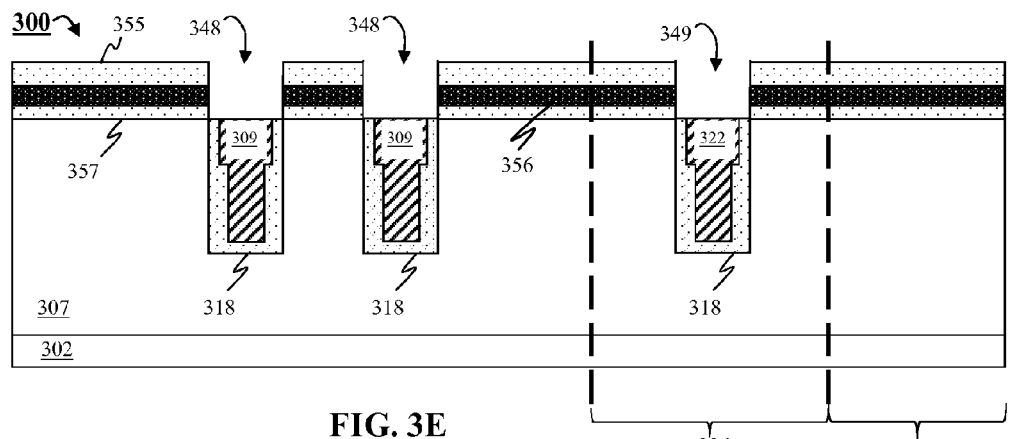
Figure 3F:
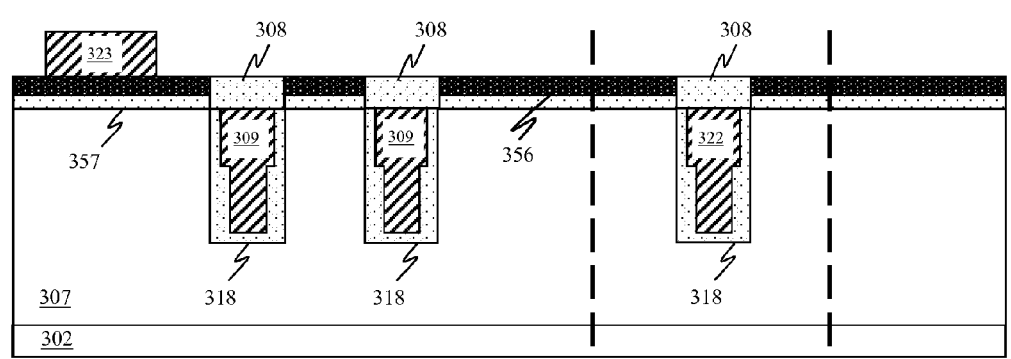
Figure 3G:
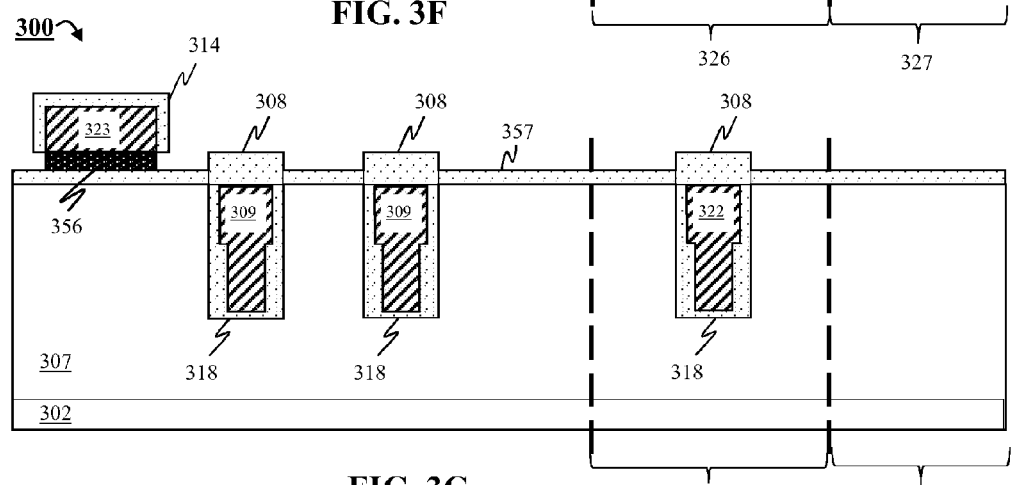
Figure 3H:
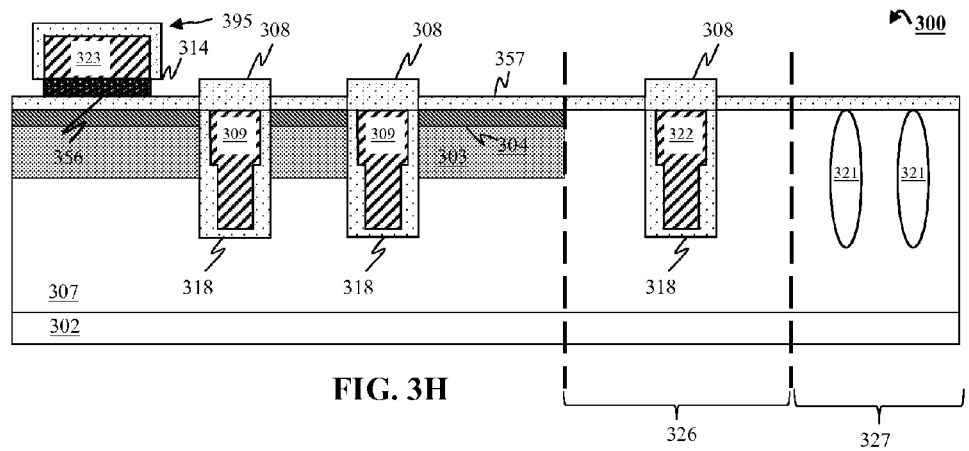
Figure 3I:
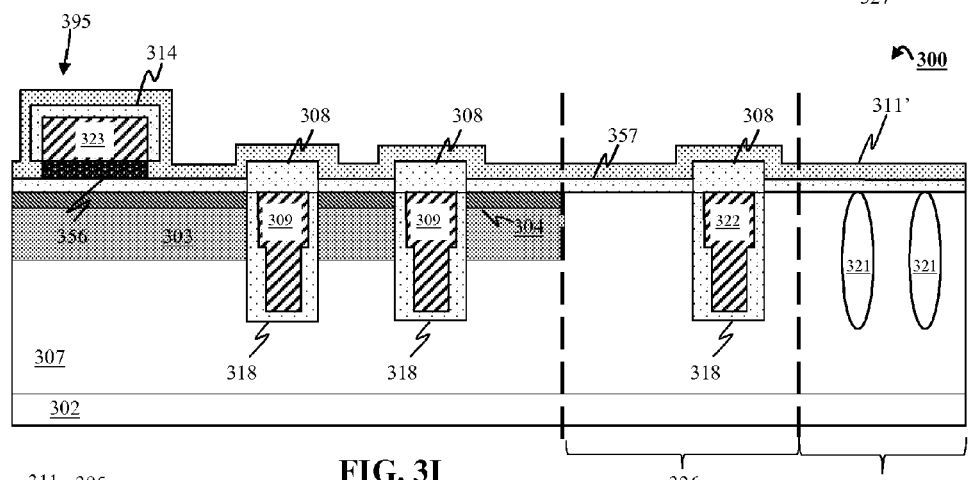
Figure 3J:
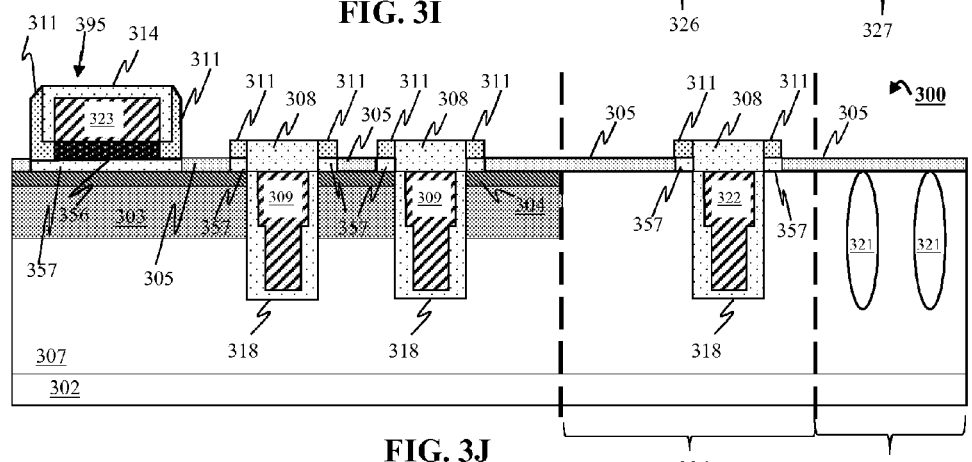
Figure 3J:
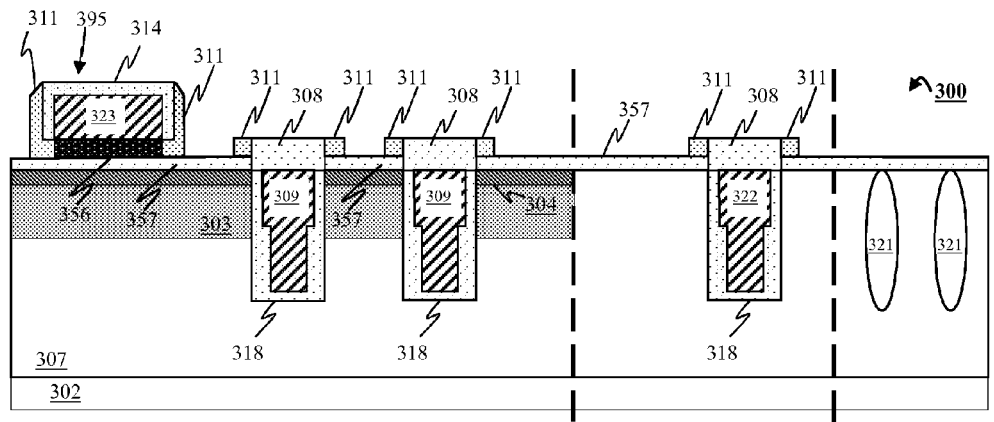
Figure 3K:
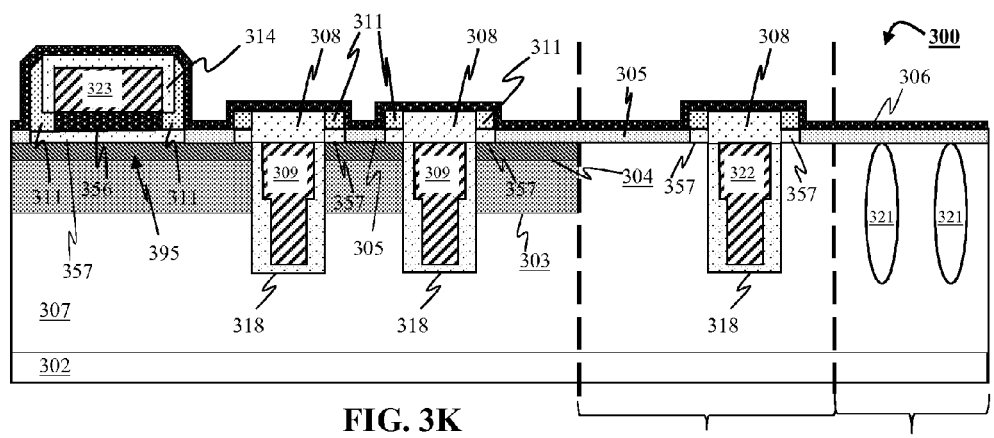
Figure 3L:
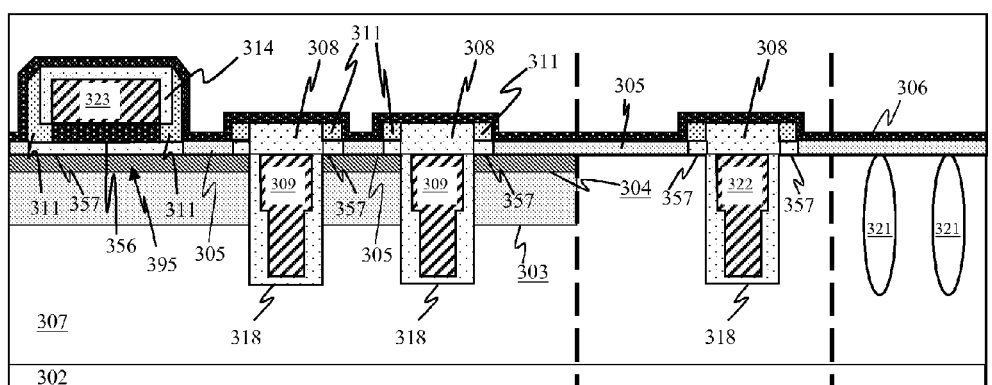
Figure 3M:
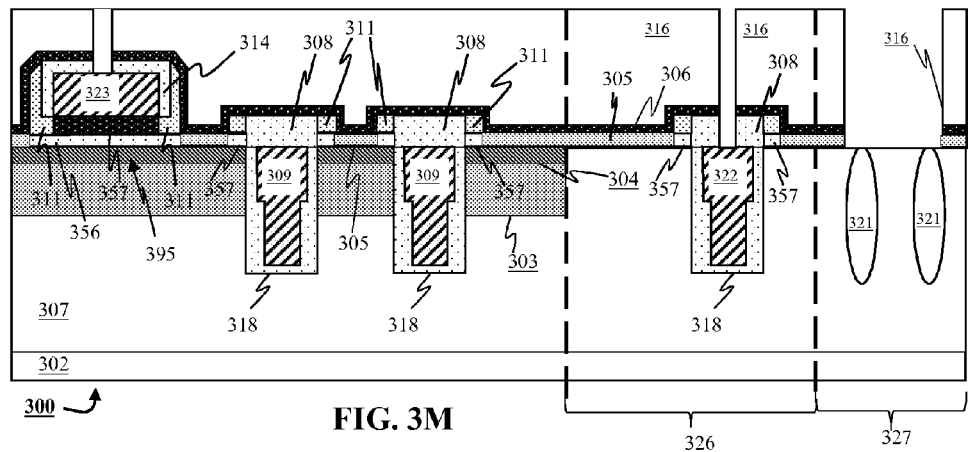
Figure 3N:
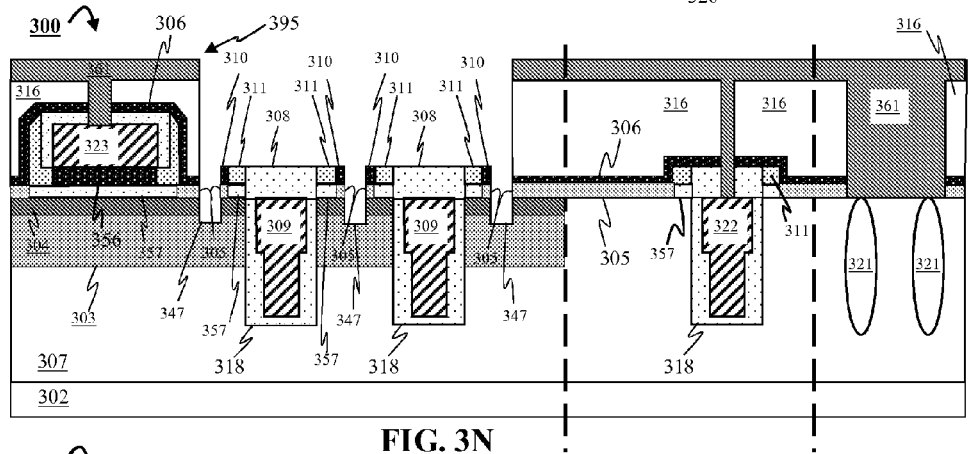
Figure 3O:
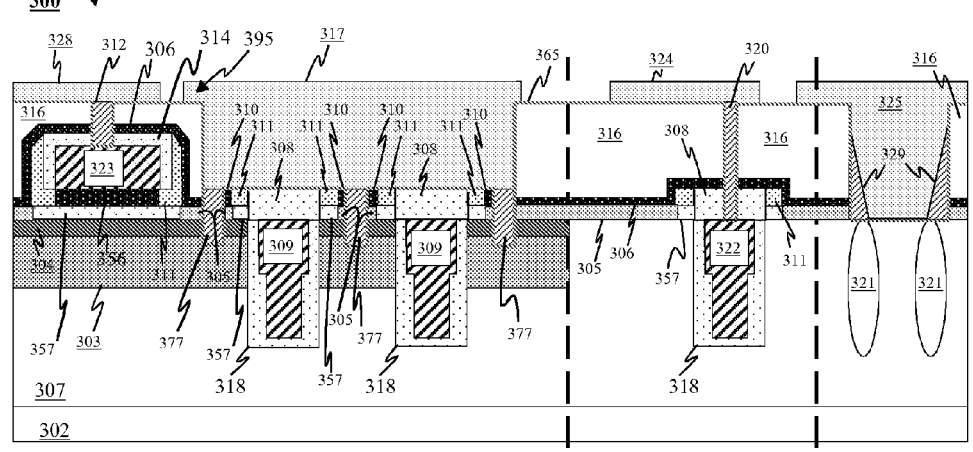

FIGS. 3A-3O are cross sectional views of a device structure 300 at different stages of fabrication. The vertical dotted lines serve to distinguish between the active region, the gate pickup region 326, and the Schottky region 327. FIGS. 3A-3O show the three regions in order from left to right, but it should be noted that this is only one of many possible orientations. Further, while all three regions are shown, it should be noted that not all regions need to be present according to aspects of the present disclosure.

FIG. 3A depicts a semiconductor substrate 301. The substrate 301 may be suitably doped to be an N-type or a P-type substrate. By way of example, and not by way of limitation, the semiconductor substrate 301 may be an N-type silicon substrate. The semiconductor substrate 301 may comprise a lightly doped drift region 307 formed in an upper portion of the substrate 301 and a heavily doped drain contact region 302 formed on a bottom portion of the semiconductor substrate 301. An oxide-nitride-oxide (ONO) hard mask layer may be formed on a top surface of the semiconductor substrate 301. By way of example and not by way of limitation, the bottom oxide layer 357 may be approximately 200 Å, the nitride layer 356 may be 3500 Å, and the top upper oxide layer 355 may be 1400 Å. FIG. 3B depicts the device structure 300 after several initial processing steps. First a trench mask is used to etch trenches 348 and 349 in the substrate 301. Trenches 348 are formed in the active region of the device structure 300, and trenches 349 are formed in the gate pickup region 326 of the device structure 300. A trench etching process may first comprise an etchant to remove the ONO hard mask layer 305, 356, 355, in order to expose the top surface of the substrate 301 and a second etching process to form the upper portion 371 of trenches 348 and 349. By way of example, and not by way of limitation, the upper portion 371 of trenches 348 and 349 may be approximately 0.5 μm deep. Once the trenches have been formed, a pad oxide $318_a$ may be thermally grown in each trench 348, 349 approximately 100 Å. After the pad oxide $318_a$ has been grown, a nitride layer 346 may be deposited over the pad oxide 318. By way of example, and not by way of limitation, the nitride layer 346 may be approximately 500 Å thick.

FIG. 3C depicts the formation of the bottom portion 372 of the trenches. First, the nitride layer 346 and the oxide layer $318_a$ on the bottom surface of the trench may be removed with one or more etching processes. Thereafter the substrate 301 below the upper portion of the trench 371 may be etched to increase the depth of the trenches 348, 349. By way of example, and not by way of limitation, the combined depth of the upper and bottom portions of the trenches 348, 349 may be approximately 1 μm. Thereafter, a liner oxide $318_b$ is thermally grown in the exposed silicon at the bottom portion 372 of the trench. By way of example, the liner oxide $318_b$ in the bottom portion of the trench may be grown to a thickness $T_2$ that is approximately 600 Å. The nitride layer 346 along the walls of the upper portion of the trench functions as a mask, and reduces the width of the bottom portion of the trench 372. The nitride 346 and the pad oxide $318_a$ at the side wall of the upper portion 371 of the trench is then removed by a wet dip. Then a gate oxide 318, is growth on the exposed silicon at the side wall of the upper portion 371 of the trench to a desired thickness $T_1$. By way of example, and not by way of limitation, the thickness $T_1$ of the gate oxide 318, may be approximately 265 Å for a 12V device. Therefore, the gate oxide 318 may have a thickness $T_2$ in the bottom portion of the trench 372 that is larger than the thickness $T_1$ of the upper portion of the trench 371. In FIG. 3D the trenches 348, 349 are filled with a conductive material in order to form the gate electrode 309, and the gate pickup electrode 322. By way of example, and not by way of limitation, conductive material may be an $N^+$-doped polysilicon, and the polysilicon may be deposited through chemical vapor deposition (CVD). Excess polysilicon may be removed and the electrodes 309 and 322 may be planarized with the surface of the hard mask using chemical mechanical polishing (CMP). Next, as shown in FIG. 3E, the electrodes 309, 322 may be etched back to the surface of the semiconductor substrate 301. The electrodes 309, 322 may be etched back with a dry etching process.

In FIG. 3F an insulative cap 308 is formed over each of the electrodes 309, 322 by using the ONO hardmask as a self-aligning mask. The use of a self-aligned mask for the insulative caps 308 reduces the possibility of misalignment when the pitch of active devices is scaled to the deep sub-micron level. By way of example, and not by way of limitation, the insulative cap may be an oxide. Once the insulative cap 308 has been formed, the top oxide layer 355 of the ONO hardmask may be removed by CMP. The insulative caps 308 may also be planarized with the nitride layer 356 with CMP. According to certain aspects of the present disclosure, an electrostatic discharge (ESD) protection feature may be optionally incorporated into the active region of the device.

To form an ESD protection feature 395, a layer of polysilicon may be formed over the surface of the nitride layer 356. An ESD mask is then used to selectively etch away portions of the polysilicon leaving behind the ESD electrode 323. In FIG. 3G the ESD electrode 323 is oxidized to form an ESD insulation cap 314 in order to protect the surface from subsequent processing steps. By way of example, and not by way of limitation, the thickness of the insulation cap 314 may be approximately 300 Å. After the ESD insulation cap 314 is formed, the nitride layer 356 may be removed. By way of example, nitride layer 356 may be removed with a hot-phosphoric acid wet dip. A portion of the nitride layer 356 below the ESD electrode 323 and the insulation cap 314 will be protected from the wet dip and will not be removed.

In FIG. 3H the body region 303 is formed. By way of example, and not by way of limitation, the body region 303 may be formed with a body mask and a blanket implantation, or through selectively implanting ions with an ion implantation system. FIG. 3H also shows the formation of the source region 304. By way of example, and not by way of limitation, the source region 304 may be formed with a source mask and a blanket source implantation, or through selectively implanting ions with an ion implantation system. The gate pickup region 326 and the Schottky region 327 may be blocked from receiving the body implant and the source implant. Additionally, FIG. 3H also depicts the body clamp (BCL) implants 321. The BCL implants are implanted with the use of a BCL mask and may be formed through one or more implantation processes. By way of example, and not by way of limitation, the first implant may be a shallow P+ implant produced by implanting $BF_2$ at approximately 40 keV. Additionally, a second implantation step may alter the depth and composition of the BCL implants 321 by using a Boron implantation at approximately 100 keV. A deep implantation may alter the depth and composition of the BCL implants 321 by using a Boron implantation at approximately 300 keV.

FIG. 3I depicts the deposition of a thick sacrificial insulation layer 311'. By way of example, the sacrificial insulation layer may be 1,100 Å thick. Further by way of example, the insulation layer 311' may be an oxide deposited by CVD with a source gas such as TEOS. Alternatively, the insulation layer 311' may be a nitride material that is deposited with a CVD process using a $SiH_4$ and $NH_3$ gas mixture. Next, in FIG. 3J the thick insulation layer 311' may be etched using an anisotropic etch, such as a dry etching process, in order to form the first insulating spacers 311 on the side of each insulating cap 308, and along the sides of the ESD structure 395. By way of example, the insulation spacers 311 may be 1000 Å thick. When the insulation layer 311' is an oxide, the etching process may stop on the silicon substrate's surface, thus removing portions of the bottom oxide layer 357 from the ONO hardmask that are not located below the first insulating spacers 311. A pad oxide 305 may then be grown over the surface of the substrate 301. By way of example, and not by way of limitation, the pad oxide 305 may be 100 Å thick.

FIG. 3J' depicts an alternative process for forming the first insulating spacers 311 in a device that may be utilized when the insulation layer 311' is a nitride material. The anisotropic etching process may selectively etch away the nitride material and leave the bottom oxide layer 357 of the ONO hardmask in place. As such, there is no need to grow the pad oxide 305. Once the first insulating spacers 311 have been formed, the processing of a device that has first insulating spacers that are made from a nitride material would then continue in substantially the same manner as that described for a process where the first insulating spacers 311 are made from an oxide.

After the first insulating spacers 311 have been formed, a sacrificial nitride layer 306 may be deposited over the surface as shown in FIG. 3K. By way of example, the nitride layer 306 may be 300 Å thick. The nitride layer 306 may be deposited with a CVD process using a $SiH_4$ and $NH_3$ gas mixture. As shown in FIG. 3L, a thick layer of borophosphosilicate glass (BPSG) 316 may be deposited over the nitride layer 306 with a CVD process.

A contact mask may be used in FIG. 3M to provide access for vertical connections to the ESD electrode 323, the gate pickup electrode 322, and the BCL structures 321. The etching process may utilize three separate etching steps. First, an etchant may be used that will remove the BPSG layer 316 and will not remove the nitride layer 306 below the BPSG. This allows for a fast etch, since there is no chance of over etching due to the nitride stop layer 306. A second etchant may then be used to selectively etch through the nitride layer 306. Thereafter, a third etchant may be used that has a high selectivity for oxide in order to break through the insulative cap 308 for the gate pickup electrode 322, the ESD insulation cap 314 for the ESD electrode, and the oxide layer 305 for the Schottky region 327.

In FIG. 3N a layer of photoresist 361 may be deposited and a second contact mask utilized to expose the active cell region. Thereafter, a first etching process may selectively remove the BPSG layer 316 over the active region. A second anisotropic etching process, such as a dry etching process, may selectively remove the sacrificial nitride layer 306. Due to the directional selectivity of the anisotropic etch, portions of the sacrificial nitride layer 306 remain after the etching. The remnants of the sacrificial nitride layer 306 become the second insulative spacer material 310. The second insulative spacer material 310 self-aligns the contact trenches 347. As mentioned previously, self-aligning the source contacts allows for enhanced scalability because it reduces the chances of misalignment. The next etching process removes the reaming oxide layer 305, and finally, the semiconductor substrate 301 is etched, for example approximately 035 Å deep, in order to allow a contact to be made with the source and body regions through the self-aligned contact trenches 347.

FIG. 3O depicts the final processing steps for the device structure 300. First a barrier metal 365 may be deposited over the entire surface. The barrier metal 365 prevents diffusion into the source region 304. By way of example, and not by way of limitation, the barrier metal may be titanium that is deposited through physical vapor deposition (PVD), or it may be an alloy such as TiN which may be deposited by CVD or PVD. After the barrier metal 365 has been deposited, a conductive material may be deposited in order to form the vertical connections 307, 312, and 320. By way of example, and not by way of limitation, the vertical connections may be made tungsten that is deposited by CVD. Once the layer of tungsten has been deposited, it may be etched back in order to leave the tungsten primarily in the vertical contact holes. Additionally, there may be excess tungsten 329 left in the Schottky region. Metal may then be deposited over the entire surface to provide appropriate contacts to the vertical connections 307, 312, and 320 and the BCL regions 321. By way of example, and not by way of limitation, the deposited metal may be sputtered aluminum. Finally, a metal mask may be used to etch away portions of the deposited metal in order to electrically isolate the contact areas into an ESD metal 328, a source metal 317, a gate metal 324, and a Schottky contact 325.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A MOSFET device, comprising:
a semiconductor substrate of a first conductivity type wherein the substrate includes a lightly doped drift region in a top portion of the substrate;
a body region of a second conductivity type formed in a top portion of the semiconductor substrate, wherein the second conductivity type is opposite the first conductivity type;
a plurality of active device structures formed from the semiconductor substrate and body region, wherein each active device structure comprises a gate electrode insulated with a gate oxide, wherein an upper portion of the gate oxide is a thickness $T_1$ and a bottom portion of the gate oxide is a thickness $T_2$, wherein $T_2$ is greater than $T_1$; one or more source regions of the first conductivity type formed in a top portion of the body region proximate the gate electrode; an insulative gate cap formed over each gate electrode, wherein a first insulating spacer is formed on the sidewalls of the insulative gate cap and a second insulating spacer is formed on the exposed side walls of the first insulating spacer,; an insulative layer over a top surface of the body region; a conductive source electrode layer formed over the insulative layer; one or more electrical connections that connect the source electrode layer with the one or more source regions, wherein the one or more electrical connections are spaced apart from the gate cap by the first and second insulative spacers.

2. The MOSFET device of claim 1, wherein the first insulating spacer and the second insulating spacer are formed from the same material.

3. The MOSFET device of claim 2, wherein the first insulating spacer and the second insulating spacer are formed from a nitride material.

4. The MOSFET device of claim 1, wherein the second insulating spacer is resistant to a first etching process used for selectively etching the material that the first insulating spacer is made from, and wherein the first insulating spacer is resistant to a second etching process used for selectively etching the material that the second insulating layer is made from.

5. The MOSFET device of claim 4, wherein the first insulating spacer is an oxide material, and the second insulating spacer is a nitride material.

6. The MOSFET device of claim 1, further comprising:
one or more electrostatic discharge (ESD) protection features formed above the insulative layer.

7. The MOSFET device of claim 1, further comprising one or more gate pickup structures formed in the semiconductor substrate.

8. The MOSFET device of claim 1, further comprising a body clamp (BCL) structure.

9. The MOSFET device of claim 1, wherein the pitch of the active device structures is less than 0.6 microns.

* * * * *